United States Patent [19]

Kim et al.

[11] Patent Number: 5,276,646
[45] Date of Patent: Jan. 4, 1994

[54] HIGH VOLTAGE GENERATING CIRCUIT FOR A SEMICONDUCTOR MEMORY CIRCUIT

[75] Inventors: Jin-Gi Kim; Woong-Mu Lee, both of Seoul, Rep. of Korea

[73] Assignee: SamSung Electronics Co., Ltd., Suwon, Rep. of Korea

[21] Appl. No.: 632,932

[22] Filed: Dec. 24, 1990

[30] Foreign Application Priority Data

Sep. 25, 1990 [KR] Rep. of Korea ............ 15225-1990

[51] Int. Cl.$^5$ ............................................. G11C 7/00
[52] U.S. Cl. ........................ 365/189.09; 365/226; 365/225.7; 307/296.1; 307/362
[58] Field of Search ............... 365/189.09, 185, 226, 365/225.7, 96, 10; 307/296.1, 296.2, 296.3, 296.4, 296.5, 296.6, 296.7, 362; 377/58, 59, 60

[56] References Cited

U.S. PATENT DOCUMENTS

| | | | |
|---|---|---|---|
| 4,769,784 | 9/1988 | Doluca et al. | 365/189.09 |
| 4,825,142 | 4/1989 | Wang | 307/296.2 |
| 4,888,738 | 12/1989 | Wong et al. | 365/183 |
| 4,935,644 | 6/1990 | Tsujimoto | 307/296.1 |
| 4,974,239 | 11/1990 | Miwada | 377/60 |
| 5,041,739 | 8/1991 | Goto | 377/296.2 |
| 5,059,815 | 10/1991 | Bill et al. | 307/296.2 |
| 5,138,190 | 8/1992 | Yamazaki et al. | 365/226 |

OTHER PUBLICATIONS

IEEE ISSS Dig. Tech. Paper, Richard Drori, et al., "A Single 5V Supply Nonvolatile Static RAM", 1981, pp. 148–149.

*Primary Examiner*—Eugene R. LaRoche
*Assistant Examiner*—Tan Nguyen
*Attorney, Agent, or Firm*—Robert E. Bushnell

[57] ABSTRACT

There is provided a high voltage generating circuit including a circuit for sensing a voltage level of a high voltage for erasing and programming operations, a circuit for generating a given reference voltage, a circuit for comparing the sensed high voltage with the reference voltage, a circuit for applying or blocking a pump signal to a high voltage pump circuit according to the compared signal, a circuit for raising the voltage up to a given level under the control of the pump signal, and an EEPROM fuse circuit connected to the circuit for sensing the voltage level of the high voltage or the circuit for generating the given reference voltage and having stored data, whereby the voltage level of the high voltage finally output may be properly maintained and controlled according to the state of the stored data.

21 Claims, 4 Drawing Sheets

FIG. 4

HIGH VOLTAGE GENERATING CIRCUIT FOR A SEMICONDUCTOR MEMORY CIRCUIT

BACKGROUND OF THE INVENTION

The present invention concerns a high voltage generating circuit for an electrically erasable and programmable semiconductor memory device (hereinafter referred to as "EEPROM"), particularly a circuit for readily adjusting level of the high voltage used in a flash-type EEPROM.

Generally, an EEPROM employs as a memory cell a floating-gate field effect transistor with an insulated floating-gate between a channel and a control gate to which a gate voltage is applied, so as to erase or program data by utilizing the electron tunnel effect between the floating-gate and the active region of the transistor.

In erasing the data, a high voltage of 15 V to 20 V is applied to the gate electrode for the electrons to tunnel from the source or drain region of the transistor to the floating-gate. Additionally, there is usually adopted a method to erase the data of all the memory cells at once in the case of a flashtype EEPROM. In programming, the floating-gate field effect transistor serving as a memory cell is made into a depletion type by grounding a control gate electrode thereof and applying a high voltage to a drain thereof. Hence, the EEPROM generally includes a high voltage generating circuit required for carrying out the above erasing and programming operation.

Referring to FIG. 1 for illustrating a conventional high voltage generating circuit, there are connected in series a plurality of pump circuits 1 which responds to pump clock pulses 4, 4' produced from an oscillator. A pump circuit 1 of a first stage is connected with a NMOS transistor 2 whose drain and gate are commonly connected to a source voltage terminal Vcc. The pump clock pulses 4, 4' have opposite phases.

The output of the pump circuit of a final stage is connected with a high voltage output terminal 10 that is to apply an erasing voltage of high level to the control gate electrode of a memory cell. The erasing voltage is provided through a row decoder to a corresponding word line or through a programming latch circuit (not shown) to a bit line that are connected with the drain of the memory cell.

Between the high voltage output terminal 10 and the source voltage terminal is interposed a N-type pull-up transistor 5 with the drain and gate connected to the source voltage terminal. Also, between the high voltage output terminal 10 and a ground voltage terminal is interposed a N-type clamping transistor 3 with the source and gate connected with the ground voltage terminal.

Each respective pump circuit 1 comprises a pair of capacitors 6, 8 having one electrodes connected to the pump clock pulses 4, 4' and the other electrodes connected to the gates and drains of NMOS transistors 7, 9. The NMOS transistor 2 drops the source voltage Vcc by a threshold voltage Vth thereof. The dropped voltage is applied to the drain and gate of the NMOS transistor 7 of the pump circuit 1 that responds to the pump clock pulses 4, 4' so as to increase the dropped voltage to a given high level. It will be readily appreciated by one having the ordinary knowledge in this art that the level of the high voltage output through the high voltage output terminal 10 depends on the number of the pump circuits 1.

Meanwhile, the pull-up transistor 5 serves to maintain the voltage of the high voltage output terminal 10 at Vcc-Vth when the pump circuits 1 are not operable. Though the clamping transistor 3 is a NMOS transistor, it operates in a breakdown region because the gate thereof is connected to the ground voltage terminal.

In such a conventional high voltage generating circuit, whenever the pump clock pulses 4, 4' are applied to the pump circuits 1, the voltage output of the pump circuits 1 is increased, and the increased voltage is clamped by the clamping transistor 3 in the breakdown level thereof.

Consequently, the clamping transistor 3 directly receives the stress caused by the high voltage output, and therefore it is liable to be destroyed. Moreover, the clamping transistor 3 is affected by the variable factors involved in the manufacturing process thereof, so that the breakdown voltage may not be definitely established, thereby making it difficult to adjust the high voltage level. Thus, after the memory device is manufactured, it is impossible to adjust the high voltage level.

SUMMARY OF THE INVENTION

It is an object of the present invention to provide a high voltage generating circuit wherein the level of a high voltage used as an erasing and a programming voltage in an EEPROM may be suitably adjusted.

According to the present invention, a high voltage generating circuit includes a circuit for sensing the level of a voltage finally output to be used for the erasing and programming, a circuit for comparing the output voltage with a given reference voltage, and a circuit for suitably adjusting the level of the output voltage according to the erasing and programming states of a memory cell.

The present invention will now be described more specifically with reference to the drawings attached only by way of example.

BRIEF DESCRIPTION OF THE ATTACHED DRAWINGS

FIG. 1 shows a conventional circuit diagram;
FIG. 2 is a block diagram for illustrating a principle of the inventive circuit;
FIG. 3 is an embodiment of the present invention; and
FIG. 4 is another embodiment of the present invention.

DETAILED DESCRIPTION OF CERTAIN PREFERRED EMBODIMENTS

Figure 1:
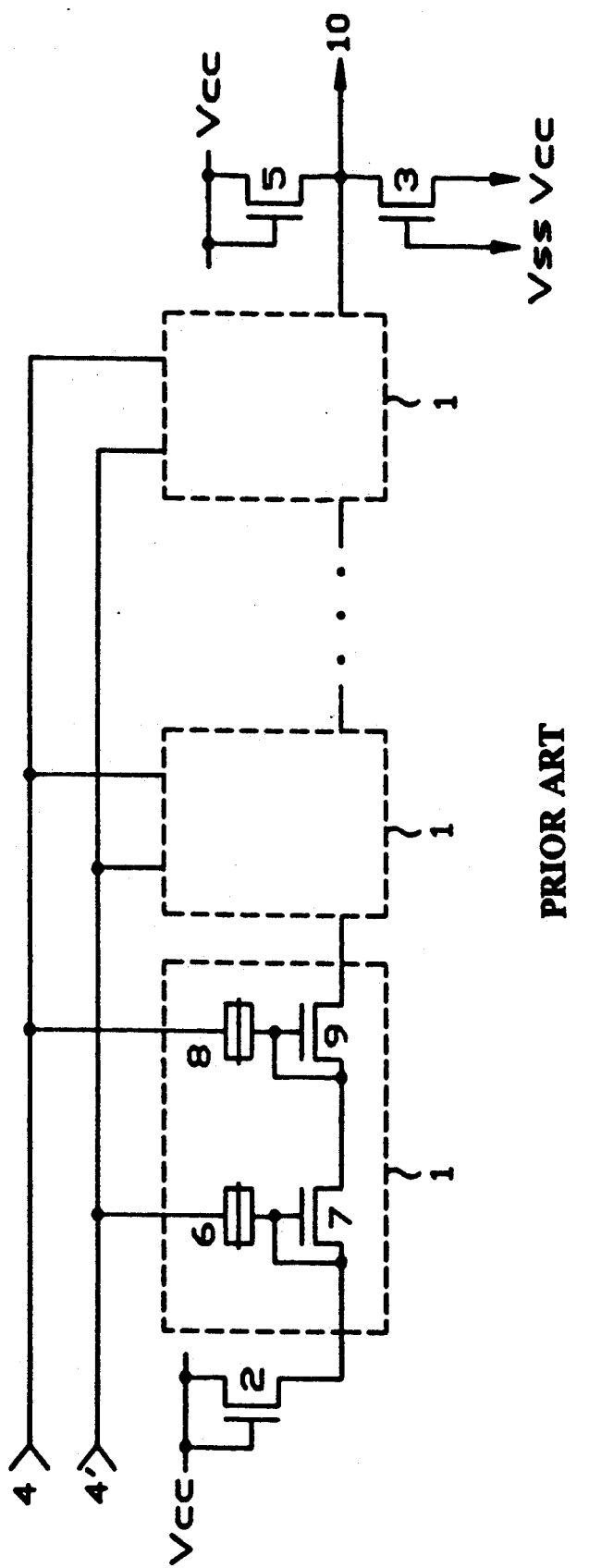
Figure 2:
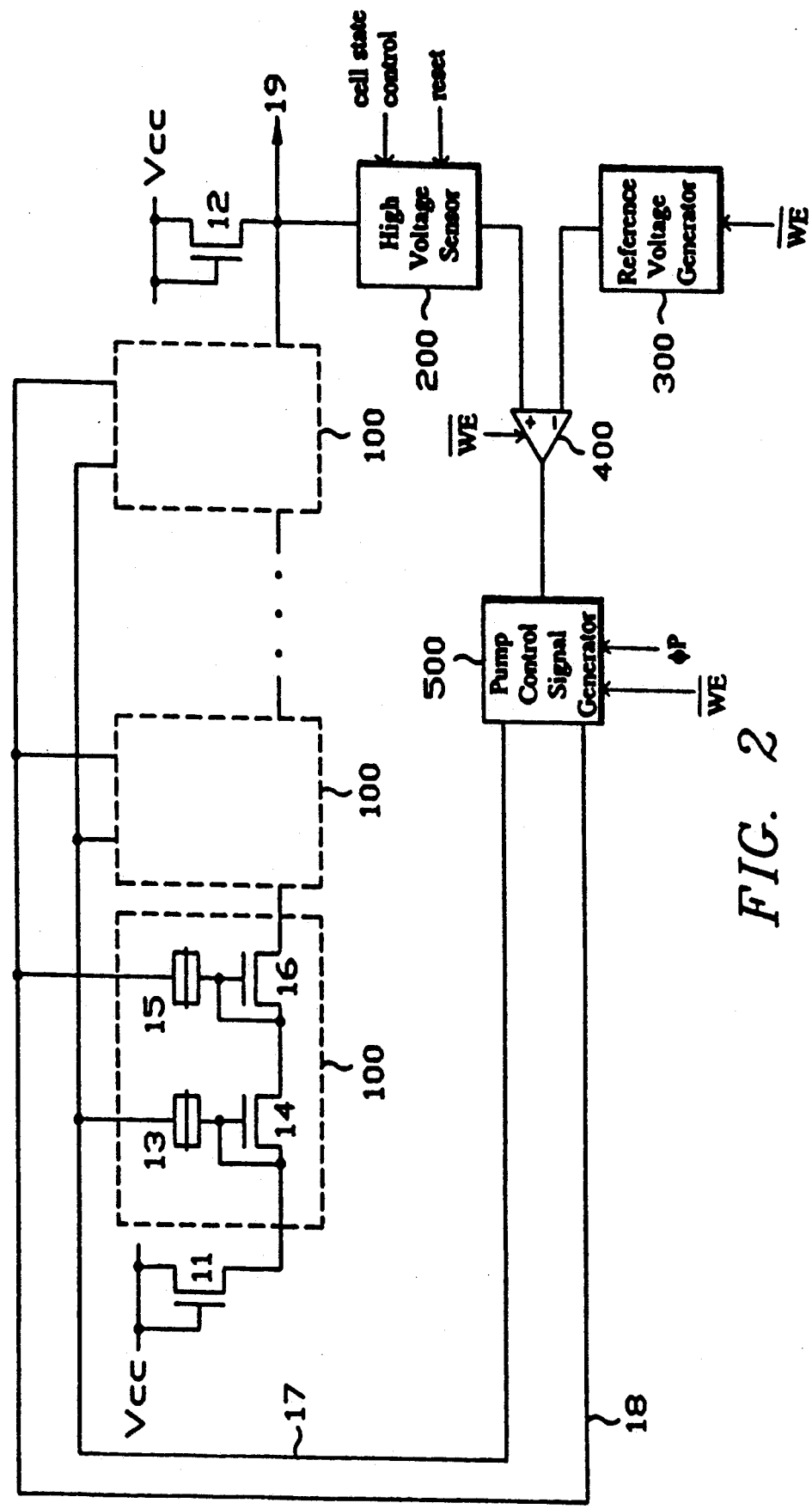

Referring to FIG. 2, a high voltage generating circuit of the present invention includes a first and a second pull-up transistors 11 and 12 whose drains and gates are connected to a source voltage terminal Vcc, and a plurality of voltage pump circuits 100 connected in series between the source of the first pull-up transistor 11 and the source of the second pull-up transistor 12, the source of second pull-up transistor being coupled to a high voltage output terminal 19. The voltage pump circuit 100 includes capacitors 13, 15 and transistors 14, 16, which is the same construction as the pump circuit 1 of FIG. 1. The first and second pull-up transistors 11 and 12 respectively are the same kind as the NMOS transistor 2 and the pull-up transistor 5.

Between the high voltage output terminal 19 and the voltage pump circuit 100 is interposed a feedback circuit. Namely, the feedback circuit includes a high voltage sensing circuit 200 connected to the high voltage output terminal 19, a reference voltage generating circuit 300 for generating a given reference voltage, a comparing and amplifying circuit 400 for comparing the output of the high voltage sensing circuit 200 with the output of the reference voltage generating circuit 300 and amplifying the difference, and a pump control signal generating circuit 500 for receiving the output of the comparing and amplifying circuit 400 to generate pump control signals 17, 18 applied to the electrodes of the capacitors 13, 15 of each of the voltage pump circuits 100. The feedback circuit is provided to adjust the level of the high voltage for use as an erasing voltage or a programming voltage of the memory cell.

Figure 3:
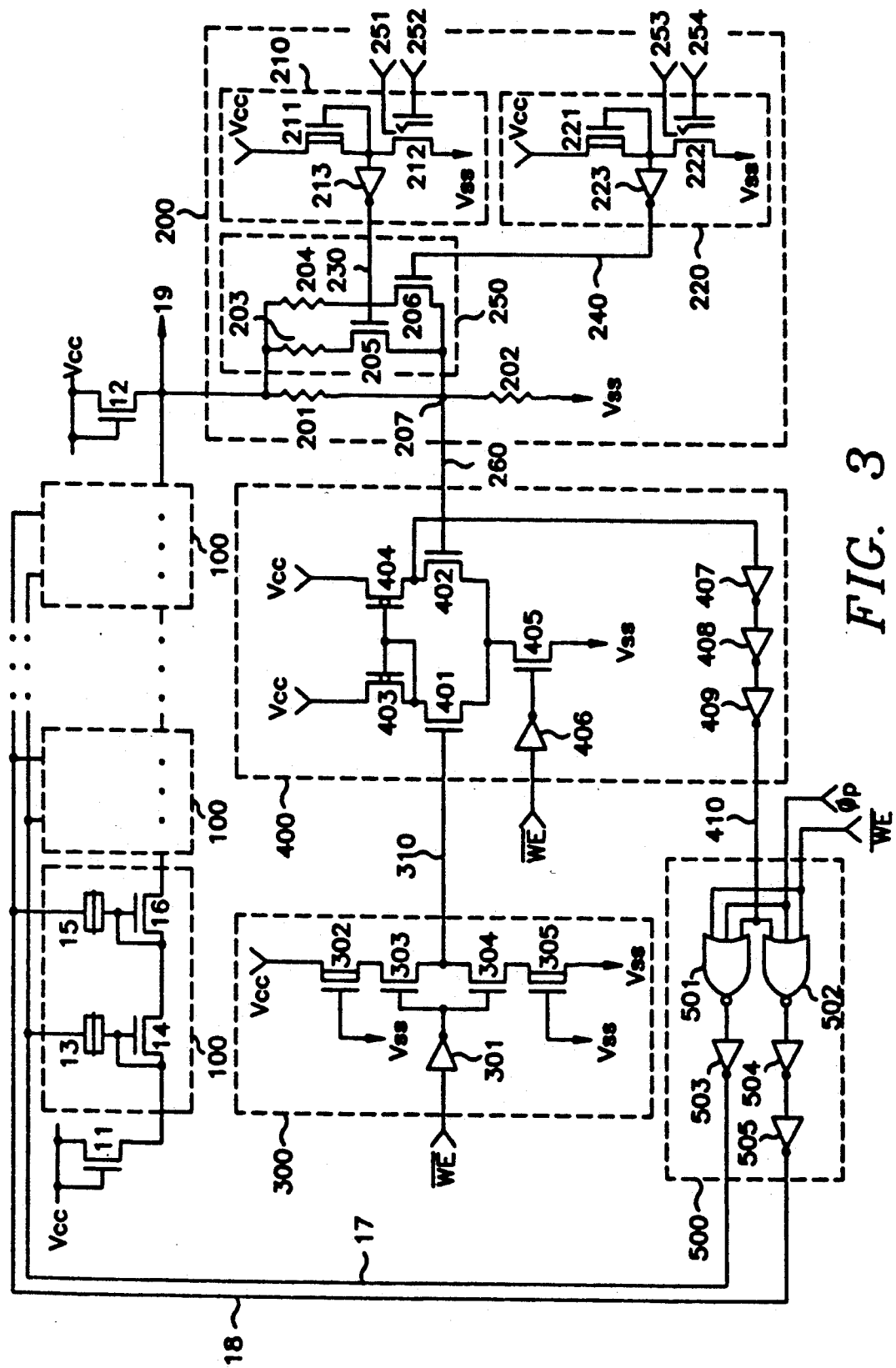
Figure 4:
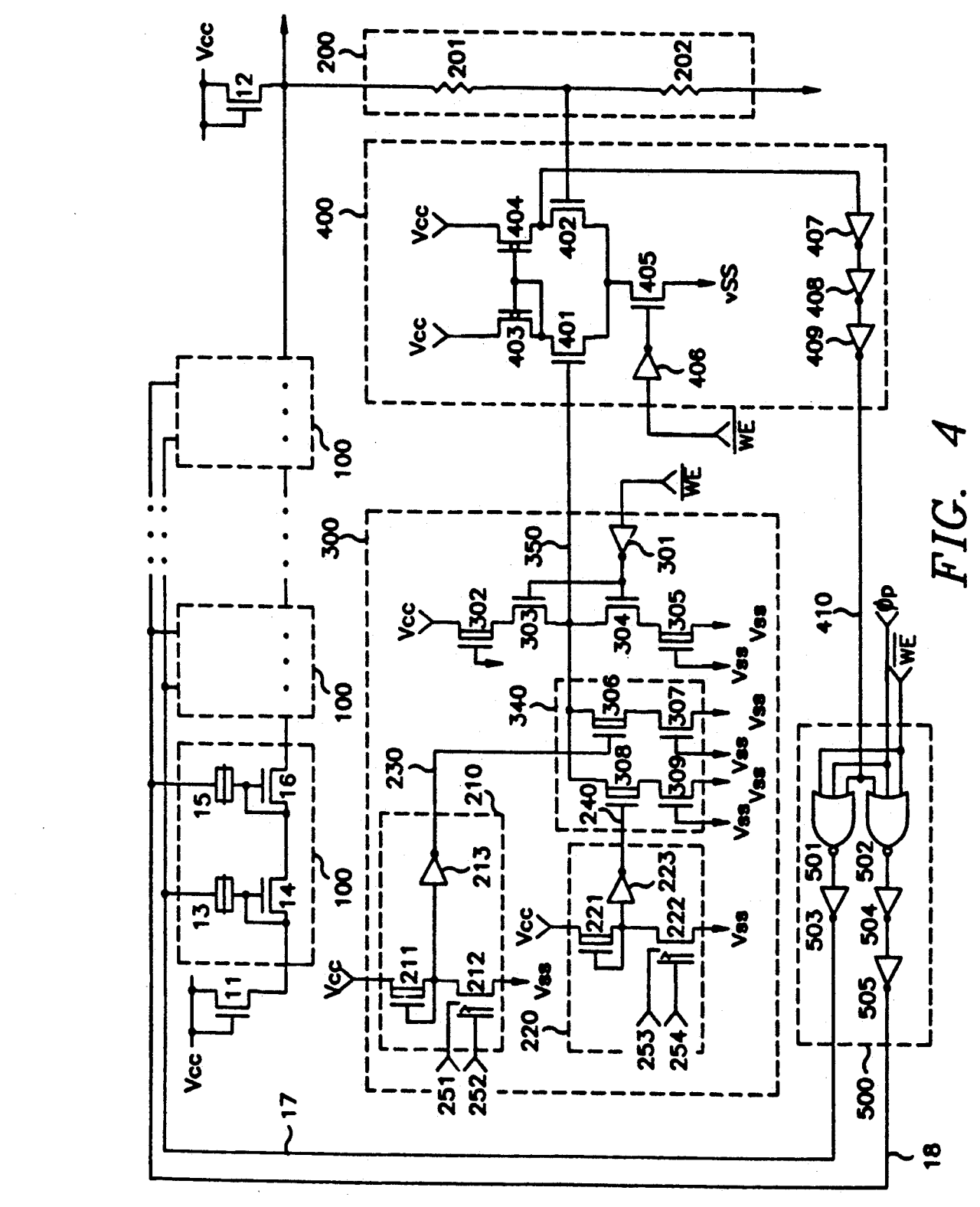

Referring to FIG. 3 for illustrating internal circuits of FIG. 2, within the high voltage sensing circuit 200 is provided EEPROM fuse circuits 210, 220 for sensing the programming state, which may be alternatively connected with the reference voltage generating circuit 300 as shown in FIG. 4.

The high voltage sensing circuit 200 includes first and second resistors 201 and 202 connected in series between the high voltage output terminal 19 and the ground voltage terminal, a dynamic resistor circuit 250 including a first and second dynamic resistors 203, 205 and 204, 206 connected in parallel with the first resistor 201, and first and second EEPROM fuse circuits 210, 220 having outputs respectively connected to the first and second dynamic resistors 203, 205 and 204, 206. The first and second dynamic resistors respectively include transistors 205, 206 and resistors 203, 204 connected in series between the high voltage output terminal 19 and the output terminal 207 of the high voltage sensing circuit 200 interposed between the first and second resistors 201 and 202. The gates of the transistors 205 and 206 are respectively connected to the outputs of the first and second EEPROM fuse circuits 210 and 220. The first and second EEPROM fuse circuits respectively include depletion transistors 211, 221 with the drain connected to the ground voltage and the gate connected to the source, floating-gate field effect transistors 212, 222 with the channels connected between the source of the depletion transistors 211, 221 and the ground voltage and the control gates connected to reset signals 252, 254, and inverters 213, 223 for inverting the outputs of the output nodes interposed between the source of the depletion transistors 211, 221 and the drains of the floating-gate field effect transistors 212, 222 to provide the gates of the transistors 205, 206 of the dynamic resistor circuits. The floating-gate field effect transistors 212, 222 serve as an EEPROM fuse cell that is erased or programmed according to cell state control signals 251, 253 applied to the drain thereof.

The reference voltage generating circuit 300 includes depletion transistors 302, 305 having normally on-state with the channels connected between the source voltage terminal and ground voltage terminal, two NMOS transistors 303, 304 connected in series between the two depletion transistors 302, 305 with the gates commonly connected to a write enabling signal $\overline{WE}$, and an inverter 301 for inverting the write enabling signal $\overline{WE}$ to provide the gates of the NMOS transistors with the inverted signal. The comparing and amplifying circuit 400 includes an N-channel input type differential amplifier consisting of two PMOS transistors 403, 404 and three NMOS transistors 401, 402, 405. The gate of the NMOS transistor 405 connected to the ground voltage Vss receives the write enabling signal $\overline{WE}$ through an inverter 406. The output of the comparing and amplifying circuit 400 passes through three inverters 407, 408 and 409.

The pump control signal generating circuit 500 includes two NOR gates 501, 502 commonly receiving given pump clock pulses $\phi p$, the write enabling signal $\overline{WE}$ and the output of the comparing and amplifying circuit 400, and inverters 503, 504, 505 for inverting the outputs of the two NOR gates 501, 502 so as to output two pump control signals 17 and 18 of opposite logics.

Referring to FIG. 4, the reference voltage generating circuit 300 is connected with the dynamic resistor circuit 340 and the EEPROM fuse circuits 210, 220. The dynamic resistor circuit 340 includes depletion transistors 307, 309 with the gates and sources commonly connected to the ground voltage terminal, which is different from FIG. 3.

The first and second dynamic resistors 306, 307 and 308, 309 of the dynamic resistor circuit 340 respectively include NMOS transistors 306 and 308 and the depletion transistors 307 and 309 connected in series between the output 350 of the reference voltage generating circuit and the ground voltage terminal. The gates of the NMOS transistors 306 and 308 are respectively connected to the outputs 230 and 240 of the first and second EEPROM fuse circuits 210 and 220. The first and second EEPROM fuse circuits 210 and 220 include depletion transistors 211, 221, floating-gate field effect transistors 212, 222 and inverters 213, 223, which is the same as that of FIG. 3.

On the other hand, the high voltage sensing circuit 200 consists of the first and second resistors 201 and 202 connected in series between the high voltage output terminal 19 and the ground voltage terminal.

The operation of the inventive circuit will now be described specifically with reference to FIGS. 2–4.

Referring to FIG. 3, the voltage of the high voltage output terminal 19 is maintained as the level of Vcc-Vth due to the second pull-up transistor 12 in the initial state where the voltage pump circuit 100 does not pump voltage.

Next, if the write enabling signal $\overline{WE}$ is enabled as "low" state in order to program data, the output 310 of the reference voltage generating circuit 300 is divided by the depletion transistors 302 and 305 so as to give the reference voltage, and the output 410 of the comparing and amplifying circuit 400 gets into "low" state, so that the pump control signal generating circuit 500 responds to the pump clock pulses $\phi p$ so as to respectively apply the pump control signals 17 and 18 of opposite logics to one electrodes of the capacitors 13 and 15 of the voltage pump circuit 100.

If the pump control signal 17 of "high" state is applied to the gate and drain of the transistor 14 connected to the source of the first pull-up transistor 11 with the gate and drain connected to the source voltage terminal Vcc, which gate and drain of the transistor 14 are initially charged with the level of Vcc-Vth, the voltage gets higher level, applied to the drain of the transistor 16 of the next stage, and the voltage of the high voltage output terminal 19 is increased to a level sufficiently high for programming, responding to the sequential oscillating of the pump clock pulses 17 and 18.

Then, the voltage of the high voltage output terminal 19 is sensed by the high voltage sensing circuit 200, of which the output 260 is compared with the output 310 of the reference voltage generating circuit 300 in the comparing and amplifying circuit 400. If the output 260 of the high voltage sensing circuit 200 is lower than the output of the reference voltage generating circuit 300, the output 410 of the comparing and amplifying circuit 400 gets into "low" state, so that the voltage pump circuit 100 keeps on increasing the voltage of the high voltage output terminal 19, responding to the pump clock pulses $\phi p$.

Alternatively, if the output 260 of the high voltage sensing circuit 200 is greater than the output 310 of the reference voltage generating circuit 300, the output 410 of the comparing and amplifying circuit 400 gets into "high" state, and the pump control signals 17 and 18 respectively gets into "high" and "low" state, so that the pump circuit 100 no longer responds to the pump clock pulses $\phi p$ stopping the pumping operation, thus no longer increasing the voltage of the high voltage output terminal 19. Namely, the voltage of the high voltage output terminal 19 is always maintained constant.

Moreover, the voltage of the high voltage output terminal 19 is controlled by controlling the level of the output 260 of the high voltage sensing circuit 200, which is accomplished by the dynamic resistor circuit 250 and the first and second EEPROM circuits 210 and 220.

Because the gates of the transistors 205 and 206 of the dynamic resistor circuit 250 connected in parallel with the first resistor 201 are respectively coupled to the outputs 230 and 240 of the first and second EEPROM fuse circuits 210 and 220, the values of the resistors for detecting or dividing the voltage of the high voltage output terminal 19 vary according to the output states of the first and second EEPROM circuits 210 and 220, whereby the output of the comparing and amplifying circuit 400 is adjusted so as to obtain the desired high voltage.

If there would not be the dynamic resistor circuit 250 and the first and second EEPROM fuse circuits 210 and 220, the output voltage of the high voltage sensing circuit 200 should be always maintained as the level of the value of the first resistor 201 × the voltage of the high voltage output terminal 19/(the value of the first resistor 201 + the value of the second resistor 202).

The outputs 230 and 240 of the first and second EEPROM fuse circuit 210 and 220 vary according to the memory state of the EEPROM fuse cells 212 and 222 that is determined by the cell state control signals 251, 253 and the reset signals 252, 254 respectively applied to the drains and control gates of the EEPROM fuse cells 212 and 222 consisting of floating-gate field effect transistors, which is the same operation as that for erasing or programming a conventional EEPROM cell.

Namely, the reset signals 252, 254 are the same as the signal applied to a word line of an EEPROM cell, while the cell state control signals 251, 253 are the same as the signal applied to a bit line connected to the drain of the EEPROM cell.

Hence, if the reset signal and the cell state control signal respectively have 18 V and 0 V, the EEPROM fuse cells 212, 222 are all erased into an enhancement type. Alternatively, if the reset signal and the cell state control signal respectively have 0 V and 18 V, the EEPROM fuse cells are programmed into a depletion type.

The EEPROM fuse cells 212, 222 have the threshold voltage about 3 V in the erased state thereof, so that even if the reset signals 252, 254 of the level 1 V to 2 V are applied to the control gates in order to read out the memory state of the cells, the EEPROM fuse cells do not conduct. Hence, in this case, the outputs 230, 240 of the EEPROM fuse circuits 210, 220 are in "low" since the EEPROM cells are not fuse conductive.

Oppositely, if the EEPROM fuse cells 212, 222 are programmed, the threshold voltage is about $-2$ V, so that the reset signals 252, 254 of about 1 V to 2 V may make the cells conduct, thus making the outputs of the corresponding EEPROM fuse circuits in "high" states. Hence, the NMOS transistors 205, 206 of the dynamic resistor circuit 250 may conduct.

If the dynamic resistor circuit 250 is driven establishing a resistor parallel with the first resistor 201, the output 260 of the high voltage sensing circuit 200 has a lower voltage level than the output 310 of the reference voltage generating circuit 300 so as to make the output 410 of the comparing and amplifying circuit 400 as "low" state, thus causing the pump circuit 100 to increase the voltage of the high voltage output terminal 19 as described above.

The voltage level of the output 260 of the high voltage sensing circuit 200 will now be described according to the states of the outputs 230, 240 of the first and second EEPROM fuse circuits 210 and 220. It is assumed the values of the first and second resistors 201 and 202 and the resistor elements 203 and 204 are respectively R1, R2, R3 and R4, and the voltages of the high voltage output terminal 19 and the high voltage sensing circuit 200 respectively Vpp and Vpd.

If the outputs 230 and 240 of the EEPROM fuse circuits 210 and 220 are respectively "high" and "low" state, Vpd=R2×Vpp/(R1 // R3+R2). Alternatively, if the outputs 230 and 240 are respectively "low" and "high" state, Vpd=R2×Vpp/(R1 // R4+R2). If the outputs are all "high" state, Vpd=R2×Vpp/(R1 //R3 //R4+R2). The output voltage of the high voltage output terminal 19 is adjusted by controlling the sensing level of the high voltage sensing circuit 200 in the embodiment of FIG. 3, but in the embodiment of FIG. 4 it is accomplished by controlling the level of the reference voltage. Namely, the dynamic resistor circuit 340 is connected between the output 350 of the reference voltage generating circuit 300 and the ground voltage terminal so as to divide the output voltage. The resistor elements of the dynamic resistor circuit are depletion transistors with the gate and channel connected to the ground voltage, which is different from the embodiment of FIG. 3.

The gates of the NMOS transistors 306 and 308 of the dynamic resistor circuit 340 are respectively connected to the outputs 230 and 240 of the first and second EEPROM fuse circuits 210 and 220. Thus, if the EEPROM fuse cells 212, 222 are all erased, the outputs all get into "low" state, so that the NMOS transistors 306 and 308 are all turned off. Consequently, the depletion transistors 307 and 309 as the voltage dividing resistor elements do not affect the voltage of the output terminal 350 of the reference voltage generating circuit 300.

However, as the outputs 230 and 240 of the first and second EEPROM fuse circuits 210 and 220 are respectively "high" and "low" or "low" and "high", or all "high", the reference voltage level of the output terminal 350 is controlled so as to change the level of the high voltage pumped.

The first and second EEPROM fuse circuits 210 and 220 commonly used in FIGS. 3 and 4 control the level of the erasing and programming voltage according to the erased and programmed state of the EEPROM fuse cells 212 and 222. For example, if the programmed state is unsound because the electrons in the floating-gate are not wholly drawn out although the program voltage of about 16 V is applied to the drain for programming the memory cell, it is necessary to apply the program voltage of higher level when programming again the memory cell, or otherwise there needs to maintain the program voltage of a proper level. Like procedure is applied to erase the memory cell. Even if the EEPROM fuse circuits 210 and 220 are not provided for the inventive circuit, the level of the high voltage output terminal 19 may be maintained constant by the high voltage sensing circuit 200, the reference voltage generating circuit 300 and the comparing and amplifying circuit 400, however, it is impossible to obtain the high voltage adjusted to a proper level according to a programmed state of the memory cell without the EEPROM circuits 210 and 220.

Although there have been described two embodiments of the present invention, other embodiments will be shown without departing the technical scope of the present invention.

As described above, the inventive circuit feeds back the output of the high voltage generating circuit in a semiconductor memory device, so as to maintain the high voltage of a constant level.

Moreover, the present invention provides the advantage that the high voltage may be adjusted to a proper level according to the programmed state of the memory cell programmed by the high voltage.

Further, the present invention improves the reliability of the memory device by obviating the overload problem occurring as the level of the high voltage is adjusted only by using the yield characteristics of a single element as in the conventional high voltage generating circuit.

Although specific constructions of the invention have been illustrated and described herein, it is not intended that the invention be limited to the elements and constructions disclosed. One skilled in the art will easily recognize that the particular elements or subconstructions may be used without departing from the scope and spirit of the invention.

What is claimed is:

1. A high voltage generating circuit for a semiconductor memory device, comprising:
   a source voltage terminal;
   a high voltage output terminal;
   plurality of voltage pump means connected in series between said source voltage terminal and said high voltage output terminal, for generating an output voltage at said high voltage output terminal representative of one of an erasing voltage and a programming voltage in dependence upon reception of first and second pump control signals, said first and second pump control signals being complementary of one another;
   high voltage sensing means interposed between said high voltage output terminal and a ground voltage terminal, for sensing a voltage level of said output voltage at said high voltage output terminal;
   reference voltage generating means interposed between said source voltage terminal and said ground voltage terminal, for generating a reference voltage in dependence upon reception of a write enabling signal;
   means for comparing the output voltage from said high voltage sensing means and said reference voltage from said reference voltage generating means to provide a difference signal, and for amplifying the difference signal to provide an amplified difference signal in dependence upon reception of said write enabling signal; and
   pump control signal generating means coupled to receive said amplified difference signal, for providing said first and second control signals to control generation of said output voltage at said high voltage output terminal in dependence upon said write enabling signal and a pump clock signal.

2. The high voltage generating circuit for a semiconductor memory device as claimed in claim 1, wherein said high voltage sensing means comprises first and second resistors connected in series between said high voltage output terminal and said ground voltage terminal, and an output node between said first and second resistors.

3. The high voltage generating circuit for a semiconductor memory device as claimed in claim 1, wherein said pump control signal generating means comprises first and second NOR gates for simultaneously receiving said write enabling signal, said pump clock signal and said amplified difference signal of said comparing and amplifying means.

4. The high voltage generating circuit for a semiconductor memory device as claimed in claim 1, wherein said reference voltage generating means comprise:
   a first depletion transistor having a first electrode of a principal electrically conducting channel connected to said source voltage terminal and a second electrode of said principal electrically conducting channel coupled to a first node;
   a first NMOS transistor having a first electrode of a principal electrically conducting channel coupled to said first node and a second electrode of said principal electrically conducting channel coupled to an output node for generating said reference voltage;
   a second NMOS transistor having a first electrode of a principal electrically conducting channel coupled to said output node and a second electrode of said principal electrically conducting channel coupled to a second node;
   a second depletion transistor having a first electrode of a principal electrically conducting channel connected to said second node and a second electrode of said principal electrically conducting channel coupled to said ground voltage terminal;
   control electrodes of said first and second depletion transistors being coupled to said ground voltage terminal; and
   control electrodes of said first and second NMOS transistors being coupled to receive said write enabling signal via an inverter.

5. The high voltage generating circuit for a semiconductor memory device as claimed in claim 1, wherein said high voltage sensing means comprises:
   first programming state sensor means for generating a first sensed signal in dependence upon reception of a cell state control signal and a reset signal;
   second programming state sensor means for generating a second sensed signal in dependence upon reception of said cell state control signal and said reset signal; and
   first and second resistors serially interposed between said high voltage output terminal and said ground voltage terminal;

a first output node positioned between said first and second resistors, for providing the sensed voltage level of said output voltage at said high voltage output terminal; and dynamic resistor means connected in parallel with said first output node and said first resistor, for controlling the sensed voltage level of said output voltage at said high voltage output terminal in accordance with selected programming and erasing voltages, wherein said dynamic resistor means comprising:

a first transistor having a first electrode of a principal electrically conducting channel connected to said source voltage terminal via a third resistor, and a second electrode of said principal electrically conducting channel connected to said first output node;

a second transistor having a first electrode of a principal electrically conducting channel connected to said source voltage terminal via a fourth resistor, and a second electrode of said principal electrically conducting channel coupled to said first output node; and control electrodes of said first and second transistors being coupled to respectively receive said first and second sensed signals.

6. The high voltage generating circuit for a semiconductor memory device as claimed in claim 5, wherein each of said first and second programming state sensor means comprises:

a depletion transistor having a first electrode of a principal electrically conducting channel connected to said source voltage terminal, a second electrode of said principal electrically conducting channel coupled to a second output node, and a control electrode connected to said output node;

a floating gate field-effect transistor having a first electrode of a principal electrically conducting channel coupled to said second output node, a second electrode of said principal electrically conducting channel connected to said ground voltage terminal, and a control electrode coupled to receive said cell state control signal and said reset signal; and an inverter connected to said second output node, for providing one of said first and second sensed signals.

7. A high voltage generating circuit for a semiconductor device, comprising:

a high voltage output terminal;

a plurality of voltage pump circuits connected in series between a source voltage terminal and said high voltage output terminal, for generating an output voltage at said high voltage output terminal in dependence upon reception of first and second pump control signals;

high voltage sensing means for sensing a voltage level of said output voltage at said high voltage output terminal, and comprising first and second resistors connected in series between said high voltage output terminal and ground voltage terminal, and an output node interposed between said first and second resistors;

reference voltage generating means connected between said source voltage terminal and said ground voltage terminal, for generating a reference voltage of a given level in dependence upon a write enabling signal;

comparing means having first and second input terminals, for comparing the output voltage from said high voltage sensing means and the reference voltage from said reference voltage generating means to provide a compared signal; and pump control signal generating means coupled to receive said compared signal, for providing said first and second pump control signals to control generation of said output voltage at said high voltage output terminal in dependence upon said write enabling signal and a pump clock signal.

8. The high voltage generating circuit for a semiconductor memory device as claimed in claim 7, wherein said high voltage sensing means comprises:

first and second sensor means for respectively generating first and second sensed signals in dependence upon a cell state control signal and a reset signal; and dynamic resistor means comprises first and second insulating-gate transistors having respective gates coupled to receive said first and second sensed signals, for generating the output voltage to said comparing and amplifying means.

9. The high voltage generating circuit for a semiconductor memory device as claimed in claim 8, wherein each of said first and second sensor means comprises:

a depletion transistor having a drain connected to said source voltage terminal and a source connected to a gate at a sensing node for providing one of said first and second sensed signals; and an EEPROM fuse cell having a channel connected between said sensing node and said ground voltage terminal, a drain coupled to receive said cell state control signal, and a control gate coupled to receive said reset signal.

10. The high voltage generating circuit for a semiconductor memory device as claimed in claim 7, wherein said pump signal generating means comprises first and second NOR gates for simultaneously receiving said write enabling signal, said pump clock signal and said compared signal from said comparing and amplifying means.

11. A high voltage generating circuit for an EEPROM comprising:

a high voltage output terminal;

a plurality of voltage pump circuits connected in series between a source voltage terminal and said high voltage output terminal, for generating an output high voltage at said high voltage output terminal in dependence upon reception of pump control signals;

high voltage sensing means for sensing a voltage level of said output high voltage at said high voltage, said high voltage sensing means comprising first and second resistors connected in series between said high voltage output terminal and a ground voltage terminal, and an output node interposed between said first and second resistors;

dynamic resistor means comprising an insulating-gate transistor and a resistor connected in parallel with the first resistor of said high voltage sensing means with a gate coupled to receive a given control signal;

reference voltage generating means connected between said source voltage terminal and said ground voltage terminal, for generating a reference voltage of a given level in dependence upon a write enabling signal;

comparing and amplifying means for comparing the output of said high voltage sensing means and the reference voltage of said reference voltage generating means to provide a compared signal, and for amplifying the compared signal to provide an amplified signal; and pump control signal generating means coupled to receive said amplified signal, for generating the pump control signals to control generation of said output high voltage at said high voltage output terminal in dependence upon reception of said write enabling signal, a pump clock signal.

12. The high voltage generating circuit of an EEPROM as claimed in claim 11, further comprised of EEPROM sensor means for generating the given control signal to the gate of said insulating-gate transistor.

13. The high voltage generating circuit of an EEPROM as claimed in claim 11, wherein said EEPROM sensor means comprises:
   a depletion transistor having a drain connected to said source voltage terminal, and a source and a gate connected to a sensing node;
   an EEPROM fuse cell having a channel connected between the sensing node and said ground voltage terminal, a drain connected to a cell state control signal and a control gate connected to a reset signal.

14. The high voltage generating circuit as claimed in claim 11, wherein said reference voltage generating means comprises:
   a first depletion transistor having a first electrode of a principal electrically conducting channel connected to said source voltage terminal and a second electrode of said principal electrically conducting channel coupled to a first node;
   a first NMOS transistor having a first electrode of a principal electrically conducting channel coupled to said first node and a second electrode of said principal electrically conducting channel coupled to an output node for generating said reference voltage;
   a second NMOS transistor having a first electrode of a principal electrically conducting channel coupled to said output node and a second electrode of said principal electrically conducting channel coupled to a second node;
   a second depletion transistor having a first electrode of a principal electrically conducting channel connected to said second node and a second electrode of said principal electrically conducting channel coupled to said ground voltage terminal;
   control electrodes of said first and second depletion transistors being coupled to said ground voltage terminal; and
   control electrodes of said first and second NMOS transistors being coupled to receive said write enabling signal via an inverter.

15. The high voltage generating circuit as claimed in claim 11, wherein said pump control signal generating means comprises first and second NOR gates for simultaneously receiving said write enabling signal, said pump clock signal and the amplified signal from said comparing and amplifying means, first and second inverters for respectively inverting the outputs of said first and second NOR gates to produce said pump control signals via a buffer.

16. A high voltage generating circuit for an EEPROM, comprising:

a high voltage output terminal;
a plurality of voltage pump circuits connected in series between a source voltage terminal and said high voltage output terminal, for generating an output high voltage at said high voltage output terminal in dependence upon a pair of complementary pump control signal;
high voltage sensing means interposed between said high voltage output terminal and a ground voltage terminal, for sensing a voltage level of said output voltage at said high voltage output terminal;
reference voltage generating means connected between said source voltage terminal and said ground voltage terminal, for generating a reference voltage in dependence upon a write enabling signal;
comparing and amplifying means for comparing the output of said high voltage sensing means and the reference voltage of said reference voltage generating means to provide a compared signal, and for amplifying the compared signal; and
pump control signal generating means coupled to receive the output of said comparing and amplifying means, for providing the pair of complementary pump control to control generation of said output voltage at said high voltage output terminal in dependence upon reception of said write enabling signal and a pump clock signal.

17. The high voltage generating circuit for an EEPROM as claimed in claim 16, further comprising:
   first programming state sensor means for generating a first sensed signal in dependence upon reception of a cell state control signal and a reset signal;
   second programming state sensor means for generating a second sensed signal in dependence upon reception of said cell state control signal and said reset signal; and dynamic resistor means connected in parallel between the output terminal of said reference voltage generating means and said ground voltage terminal, for controlling the voltage level of said output voltage at said high voltage output terminal in accordance with a programming and an erasing operation.

18. The high voltage generating circuit as claimed in claim 16, wherein said reference voltage generating means comprises:
   a first depletion transistor having a first electrode of a principal electrically conducting channel connected to said source voltage terminal and a second electrode of said principal electrically conducting channel coupled to a first node;
   a first NMOS transistor having a first electrode of a principal electrically conducting channel coupled to said first node and a second electrode of said principal electrically conducting channel coupled to an output node for generating said reference voltage;
   a second NMOS transistor having a first electrode of a principal electrically conducting channel coupled to said output node and a second electrode of said principal electrically conducting channel coupled to a second node;
   a second depletion transistor having a first electrode of a principal electrically conducting channel connected to said second node and a second electrode of said principal electrically conducting channel coupled to said ground voltage terminal;

control electrodes of said first and second depletion transistors being coupled to said ground voltage terminal; and control electrodes of said first and second NMOS transistors being coupled to receive said write enabling signal via an inverter.

19. A high voltage generating circuit for an EEPROM as claimed in claim 17, wherein said each of said first and second programming state sensor means comprises:
- a depletion transistor having a first electrode of a principal electrically conducting channel connected to said source voltage terminal, a second electrode of said principal electrically conducting channel coupled to an output node, and a control electrode connected to said output node;
- a floating gate field-effect transistor having a first electrode of a principal electrically conducting channel coupled to said output node, a second electrode of said principal electrically conducting channel connected to said ground voltage terminal, and a control electrode coupled to receive said cell state control signal and said reset signal; and
- an inverter connected to said output node, for providing one of said first and second sensed signals.

20. A high voltage generating circuit for an EEPROM as claimed in claim 16, wherein said pump control signal generating means comprises first and second NOR gates for simultaneously receiving said write enabling signal, said pump clock signal and the output of said comparing and amplifying means, first and second inverters for respectively receiving the outputs of said first and second NOR gates to produce said pair of complementary pump control signals.

21. In an EEPROM having a plurality of voltage pump circuits connected in series and disposed between a source voltage terminal and a high voltage output terminal, for generating a high voltage output at said high voltage output terminal in dependence upon a pair of complementary pump control signals, a method for adjusting a voltage level of said high voltage output adaptable for use as either an erasing voltage for an erasing operation or a programming voltage for a programming operation, comprising the steps:
- detecting and sensing the voltage level of said high voltage output at said high voltage output terminal to provide a sensed voltage having a voltage level in accordance with a selected one of the erasing operation and the programming operation;
- generating a reference voltage in dependence upon a write enable signal;
- comparing the sensed voltage and the reference voltage to provide a compared voltage in dependence upon said write enable signal;
- amplifying the compared voltage to provide an amplified voltage; and
- generating the pair of complementary pump control signals to control generation of said high voltage output at said high voltage output terminal in dependence upon reception of said write enable signal and a pump clock signal.

* * * * *

UNITED STATES PATENT AND TRADEMARK OFFICE
CERTIFICATE OF CORRECTION

PATENT NO. : 5,276,646
DATED : January 4, 1994
INVENTOR(S) : Jin-Gi Kim; et al.

It is certified that error appears in the above-indentified patent and that said Letters Patent is hereby corrected as shown below:

IN THE CLAIMS

Column 12, Line 5, After "output", Delete "high" ;

Line 7, Change "signal" to --signals-- .

Signed and Sealed this

Twenty-seventh Day of September, 1994

*Attest:*

BRUCE LEHMAN

*Attesting Officer*    *Commissioner of Patents and Trademarks*